United States Patent
Bowker et al.

(10) Patent No.: US 6,231,998 B1
(45) Date of Patent: May 15, 2001

(54) THERMAL BARRIER COATING

(75) Inventors: Jeffrey Charles Bowker, Gibsonia, PA (US); Stephen M. Sabol, Orlando; John G. Goedjen, Oviedo, both of FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/304,403

(22) Filed: May 4, 1999

(51) Int. Cl.[7] .............................. B32B 15/00; B32B 9/00; C23C 4/10
(52) U.S. Cl. .................. 428/623; 428/629; 428/633; 428/678; 428/679; 428/680; 428/472; 427/453; 427/419.2; 427/419.3; 416/241 B
(58) Field of Search .......................... 428/472, 472.1, 428/623, 629, 632, 633, 678, 679, 680; 416/241 B; 427/453, 419.2, 419.3

(56) References Cited

U.S. PATENT DOCUMENTS

| | | |
|---|---|---|
| 4,576,874 | 3/1986 | Spengler et al. |
| 4,639,399 | 1/1987 | Aprigliano . |
| 4,880,614 | 11/1989 | Strangman et al. |
| 4,913,961 | 4/1990 | Jones et al. |
| 4,916,022 | 4/1990 | Solfest et al. |
| 5,059,095 | 10/1991 | Kushner et al. |
| 5,180,285 | 1/1993 | Lau . |
| 5,773,141 * | 6/1998 | Hasz et al. ............... 428/335 |
| 5,912,087 * | 6/1999 | Jackson et al. ............ 428/610 |
| 5,939,147 * | 8/1999 | Jones ........................ 427/453 |

FOREIGN PATENT DOCUMENTS 0 718 419 A2  6/1996  (EP) .
0 718 420 A1  6/1996  (EP) .
   07073891 *  3/1995  (JP) .

OTHER PUBLICATIONS

Thornber et al., Mixed Oxides of the type MO2 (fluorite)–M2O3. University Western Australia, Acta Crystallogr., Sect. B, 1968.*
Batalin et al., Formation of compounds of complex composition in the films of binary oxide systems. Kiev. Gos. Univ. Izv. Akad. Nauk SSSR, Neorg. Material, 1990.*
Wright Laboratory, Oxygen Barrier Oxides, WL–TR–91–4059 Final Report for Period 6/89–10/90, 1990, Mar. 1992.
R.L. Jones, Scandia–Stabilized Zirconia for Resistance to Molten Vandate–Sulfate Corrosion, Surface and Coatings Technology, 39/40 (1989) 89–96, Elsevier Sequoia (No Month).
H.J. Rossell, Crystal Structures of Some Fluorite–Related M O Compounds, Journal of Solid State Chemistry 19, 103–111 (1976) (No Month).
Robert L. Jones; Experiences in Seeking Stabilizers for Zirconia Having Hot Corrosion–Resistance and High Temperature Tetragonal (t3) Stability; Naval Research Laboratory; Apr. 16, 1996; 21 pgs.

* cited by examiner

Primary Examiner—Timothy M. Speer
Assistant Examiner—Bryant Young

(57) ABSTRACT

A thermal barrier coating for hot gas path components of a combustion turbine based on a zirconia-scandia system. A layer of zirconium scandate having the hexagonal $Zr_3Sc_4O_{12}$ structure is formed directly on a superalloy substrate or on a bond coat formed on the substrate.

22 Claims, 1 Drawing Sheet

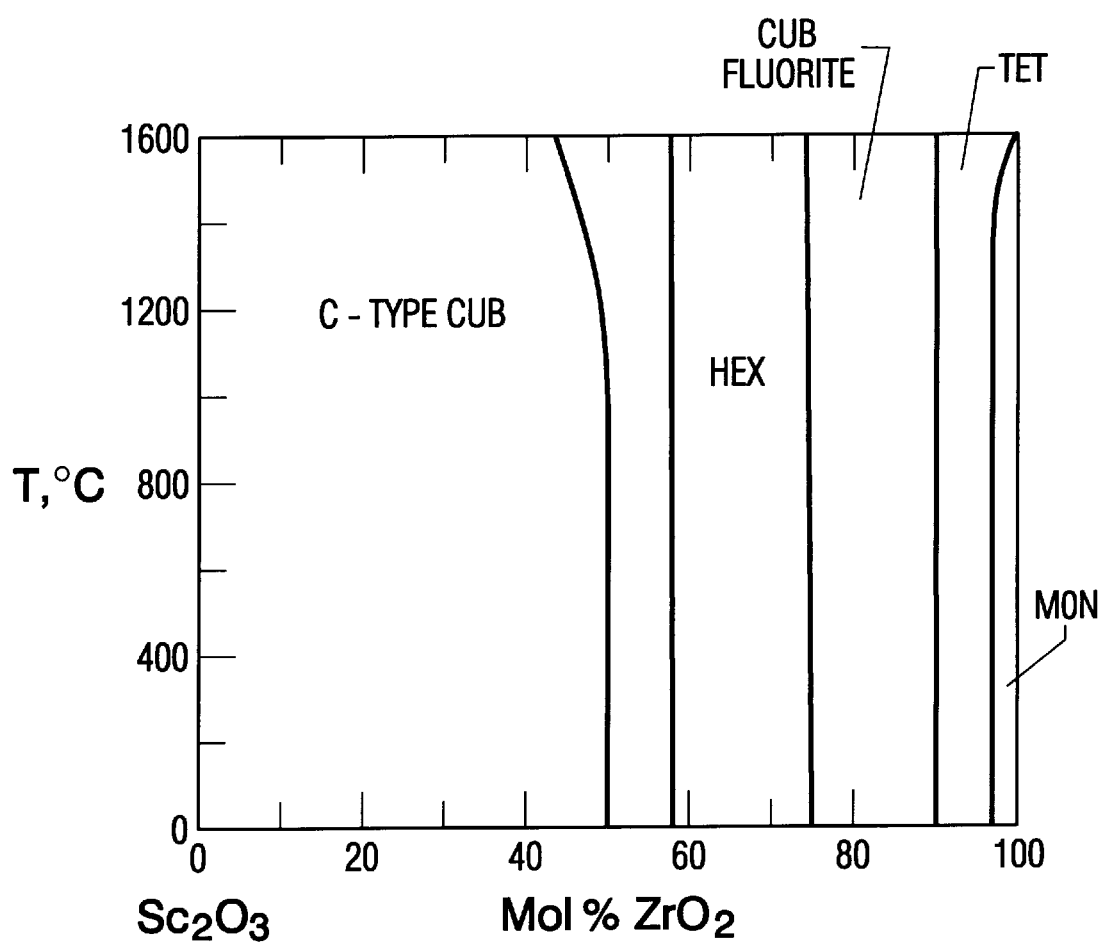

THERMAL BARRIER COATING

This invention was made with United States Government support under contract number DE-FC2195MC32267 awarded by the Department of Energy. The Government has certain rights in this invention.

FIELD OF THE INVENTION

This invention relates generally to the field of thermal barrier coatings, and more particularly to the field of thermal barrier coatings for use in very high temperature applications such as in the hot gas path of a combustion turbine engine.

BACKGROUND OF THE INVENTION

It is well known to utilize a ceramic coating to improve the corrosion resistance and mechanical durability of a gas/combustion turbine component. The demand for continued improvement in the efficiency of such turbines and combined cycle power plants has driven the designers of these systems to specify increasingly higher firing temperatures in the combustion portions of these systems. Although nickel and cobalt based superalloy materials are now used for components such as combustor transition pieces and turbine rotating and stationary blades in the hot gas flow path, even superalloy materials are not capable of surviving long term operation without some form of insulation from the operating environment.

It is known to coat a superalloy metal component with an insulating ceramic material to improve its ability to survive high operating temperatures in a combustion turbine environment; see for example U.S. Pat. No. 5,180,285 issued on Jan. 19, 1993 to Lau, and U.S. Pat. No. 4,576,874 issued on Mar. 18, 1986 to Spengler, et al, both incorporated by reference herein. One thermal barrier coating system in common use today is a yttria stabilized zirconia (YSZ) top coat applied to a super alloy substrate structure, often with an intermediate bond coat such as MCrAlY, where M may be nickel, cobalt, iron or a mixture thereof. However, even YSZ coated super alloy components are not capable of withstanding long term operation at the operating temperatures of the most modern and efficient engines where combustion temperatures may exceed 1,400 degrees C.

Accordingly, it is an object of this invention to provide an improved thermal barrier coating for the hot gas flow path components of a modern combustion turbine system. It is a further object of this invention to provide a component for a combustion turbine capable of long term operation in the high temperature, highly corrosive environment of the most modern of combustion turbine engines.

SUMMARY

In order to achieve these and other objects of the invention, a component capable of operating in a high temperature environment is provided, the component comprising: a superalloy substrate; a bond coat layer disposed on said superalloy substrate; a ceramic insulating layer disposed on said bond coat layer, said ceramic insulating layer comprising a hexagonal $Zr_3Sc_4O_{12}$ structure.

BRIEF DESCRIPTION OF THE DRAWING

The sole FIGURE is a $zrO_2Sc_2O_3$ phase diagram.

DESCRIPTION OF THE PREFERRED EMBODIMENTS

While prior art yttria stabilized zirconia thermal barrier coatings have provided adequate thermal barrier protection of hot gas path internally cooled metallic components for several generations of aero-engines and land based combustion turbines, the gas path temperatures anticipated for the next generation and beyond land based engines are expected to exceed the capabilities of YSZ systems. Specifically, the higher temperatures anticipated for these engines are expected to cause phase and micro-structural instabilities in the YSZ that will lead to accelerated in-service degradation of the ceramic layer and accelerated fracture and failure of the ceramic top layer.

Yttria stabilized zirconia thermal barrier coatings are applied by either air plasma spray (APS) or electron beam physical vapor deposition (EB-PVD). The rapid quenching of the liquid or vapor results in a coating comprised primarily of a metastable "non-transformable" tetragonal phase with minor amounts of cubic and monoclinic zirconia. Retention of the non-transformable tetragonal phase (T') is required for long coating life. Upon heating above about 2,000° F. (about 1,100° C.), diffusion processes result in a time and temperature dependent separation of the metastable, non-transformable T' phase into the thermodynamically stable transformable tetragonal and cubic phases. As the temperature is increased, the tendency for this separation to occur increases. On subsequent thermal cycling, the transformable tetragonal phase will undergo a phase change to monoclinic (M) zirconia. This equilibrium transformation from T' to M will be encountered upon every subsequent thermal cycle. This transformation is accompanied by a significant volume and shape change; about 4% increase in molar volume and 9 degree shear. These changes set up very severe local cycling strains and accelerated thermal fatigue failure is induced.

It is known that YSZ is susceptible to sintering at high temperatures and that such sintering causes a reduction in the thermal resistance, or conversely an increase in thermal conductivity. This change is due to the sintering of the fine grain structure of the as deposited "splats" to produce a coarser grain, more highly thermally conductive material, or to the sintering together of the EB-PVD column structure. Recent work by the inventors indicates an unacceptable sintering rate for YSZ at the temperatures expected for the next generation turbines. Under such conditions the heat flow through the thermal barrier coating will increase and the bond coat under the YSZ will oxidize more rapidly, thereby further reducing the useful life of the YSZ-based thermal barrier coating system. Furthermore, the thermal barrier coating strain compliance is reduced, leading to a reduced ability to accommodate thermal mismatch strains between the coating and the substrate and/or bond coat. This increased stress state also contributes to the premature failure of the coating.

The applicants have discovered that a zirconia-scandia based thermal barrier coating system will provide improved high temperature performance when compared to the prior art YSZ-based system. It can be seen from the figure, a $ZrO_2$—$Sc_2O_3$ phase diagram, that the hexagonal phase, zirconium scandate having the crystal structure of $Zr_3Sc_4O_{12}$, is formed at about 58–75 mole weight percent $ZrO_2$. Other published data indicates that the crystal structure of $Zr_3Sc_4O_{12}$ is formed at about 60–72 mole weight percent $ZrO_2$, with the limit of the range of the hexagonal phase varying somewhat with temperature. Zirconium scandate is a single-phase material from ambient temperature to temperatures exceeding 2,500 degrees F. (approximately 1,400 degrees C.). These temperatures exceed the anticipated operating temperatures for the next generation of turbine engines. Zirconium scandate has a significant compositional range over which it is stable at these temperatures. This stability range means that slight variations in composition resulting from coating deposition or from selective corrosion during service will not cause phase instability. Because zirconium scandate will not undergo a phase change, it is not subject to the local stress and stain associated with the phase changes in the prior art coatings when applied to the most modern combustion turbine engine components, and therefore extended operating life can be achieved.

Zirconium scandate can be applied to a superalloy substrate by known techniques, such as APS and EB-PVD. The applicants have found that a layer of zirconium scandate having a thickness of from 5–30 mils provides advantageous performance results. Some applications may require a layer of zirconium scandate having a greater thickness, such as, for example, 5 to 65 mils. The zirconium scandate can be applied directly onto the superalloy substrate, or the superalloy substrate may be thermally treated prior to depositing the zirconium scandate. The step of thermally treating the substrate will oxidize a thin layer of the surface of the superalloy material, thereby providing for improved adherence between the substrate and the deposited oxide. Alternatively, an oxidization resistant bond coat layer, for example a layer of MCrAlY or an aluminide diffusion coating, may be formed on the substrate prior to the step of depositing a layer of zirconium scandate.

Zirconium scandate is likely to be more resistant to sintering than YSZ due to its relatively low oxygen diffusivity. YSZ, by comparison, has a high oxygen vacancy concentration due to the substitution of trivalent yttrium for tetravalent zirconium. Although these vacancies are primarily on oxygen ion sites, their presence makes diffusion of all species easier, thereby resulting in relatively easy sintering.

Other characteristics of zirconium scandate may provide additional benefits in its use as a thermal barrier coating for turbine components. Zirconium scandate is reported to have oxygen permeability about two orders of magnitude lower than fully stabilized cubic zirconia. This characteristic will reduce the penetration of oxygen to the bond coat, thereby reducing undesirable oxidation. It is also reported that scandia-stabilized zirconia has much greater resistance to sulphate and vanadate hot corrosion than YSZ because scandia is not selectively leached by molten vanadate solutions. This characteristic should provide improved corrosion resistance to fuel impurities. The higher the mole weight percent scandia, the better will be the resistance of the coating to such corrosion, since there will be more scandia available to react before a phase change occurs. Therefore, one embodiment of the present invention may utilize zirconium scandate having the hexagonal $Zr_3Sc_4O_{12}$ structure with a mole weight percentage of $ZrO_2$ of between 60–65%. Conversely, the price of the coating may increase as the amount of scandia is increased, so another embodiment of the present invention may utilize zirconium scandate having the hexagonal $Zr_3Sc_4O_{12}$ structure with a mole weight percentage of $ZrO_2$ of between 70–75%.

Other aspects, objects and advantages of this invention may be obtained by studying the disclosure and the appended claims.

We claim as our invention:

1. A component capable of operating in a high temperature environment, the component comprising:
   a superalloy substrate;
   a bond coat layer disposed on said superalloy substrate;
   a ceramic insulating layer disposed on said bond coat layer, said ceramic insulating layer comprising a hexagonal $Zr_3Sc_4O_{12}$ structure.

2. The component of claim 1, wherein said ceramic insulating layer has a thickness of 5 to 65 mils.

3. The component of claim 1, wherein said ceramic insulating layer comprises a mole weight percentage of $ZrO_2$ of between 60–65%.

4. The component of claim 1, wherein said ceramic insulating layer comprises a mole weight percentage of $ZrO_2$ of between 70–75%.

5. The component of claim 1, wherein said bond coat layer comprises an aluminide diffusion coating.

6. The component of claim 1, wherein said bond coat layer comprises MCrAlY, where M may be nickel, cobalt, iron or a mixture thereof.

7. The component of claim 1, wherein said substrate is a thermally treated superalloy substrate.

8. A component capable of operating in a high temperature environment, the component comprising:
   a superalloy substrate;
   a ceramic insulating layer disposed on said superalloy substrate, said ceramic insulating layer comprising a hexagonal $Zr_3Sc_4O_{12}$ structure.

9. The component of claim 8, wherein said ceramic insulating layer has a thickness of 5 to 65 mils.

10. The component of claim 8, wherein said ceramic insulating layer comprises a mole weight percentage of $ZrO_2$ of between 60–65%.

11. The component of claim 8, wherein said ceramic insulating layer comprises a mole weight percentage of $ZrO_2$ of between 70–75%.

12. The component of claim 8, wherein said substrate is a thermally treated superalloy substrate.

13. A thermal barrier coating for a component forced with a superalloy substrate comprising:
   a bond coat disposed on said superalloy substrate; and
   a ceramic insulating layer comprising a hexagonal $Zr_3Sc_4O_{12}$ structure disposed on said bond coat.

14. The component of claim 13, wherein said ceramic insulating layer has a thickness of 5 to 65 mils.

15. The component of claim 13, wherein said ceramic insulating layer comprises a mole weight percentage of $ZrO_2$ of between 60–65%.

16. The component of claim 13, wherein said ceramic insulating layer comprises a mole weight percentage of $ZrO_2$ of between 70–75%.

17. A method of manufacturing a turbine component comprising the steps of:
   providing a superalloy substrate;
   coating at least a portion of said superalloy substrate with a ceramic insulating layer comprising a hexagonal $Zr_3Sc_4O_{12}$ structure.

18. The method of claim 17, further comprising the step of forming a bond coat layer on at least a portion of said superalloy substrate prior to the step of coating, and wherein the step of coating further comprises depositing said ceramic insulating layer on said bond coat layer.

19. The method of claim 17, further comprising the step of thermally treating said superalloy substrate to oxidize the surface thereof prior to the step of coating.

20. The method of claim 17, wherein the step of coating further comprises forming a layer of zirconium scandate to have a thickness of from 5 to 65 mils.

21. The method of claim 17, wherein the step of coating further comprises coating at least a portion of said superalloy substrate with a ceramic insulating layer comprises a mole weight percentage of $ZrO_2$ of between 60–65%.

22. The method of claim 17, wherein the step of coating further comprises coating at least a portion of said superalloy substrate with a ceramic insulating layer comprises a mole weight percentage of $ZrO_2$ of between 70–75%.

* * * * *